United States Patent [19]

Weiner

[11] Patent Number: 4,701,828

[45] Date of Patent: Oct. 20, 1987

[54] HEAT SINK ASSEMBLY

[76] Inventor: Al Weiner, 3131 NW. 79th Ave., Miami, Fla. 33122

[21] Appl. No.: 859,200

[22] Filed: Apr. 28, 1986

Related U.S. Application Data

[63] Continuation-in-part of Ser. No. 668,905, Nov. 7, 1984, abandoned, which is a continuation of Ser. No. 436,732, Oct. 26, 1982, abandoned.

[51] Int. Cl.⁴ .............................................. H05K 7/20
[52] U.S. Cl. .................................. 361/383; 361/388; 363/141
[58] Field of Search ................... 357/81; 165/80, 185; 363/141; 174/16 HS; 361/381–383, 386, 387, 388

[56] References Cited

U.S. PATENT DOCUMENTS

| 2,818,237 | 12/1957 | Lehr | 165/80 B |
| 3,213,324 | 10/1965 | McAdam | 165/80 B |
| 3,309,578 | 3/1967 | Diebold | 363/141 |
| 4,103,737 | 8/1978 | Perkins | 361/384 |
| 4,222,090 | 9/1980 | Jaffe | 361/386 |

Primary Examiner—G. P. Tolin
Attorney, Agent, or Firm—Shlesinger Arkwright & Garvey

[57] ABSTRACT

A heat sink mounting assembly for heat producing devices has a mounting plate with a plurality of positioning areas in which the heat producing devices are fixedly mounted by cooling fins punched out from the mounting plate and which leave convection openings through which cooling air circulates, the cooling fins and convection openings being proportioned to provide maximum cooling effect.

6 Claims, 3 Drawing Figures

HEAT SINK ASSEMBLY

This application is a continuation-in-part of application Ser. No. 668,905 filed Nov. 7, 1984, now abandoned, which is a continuation of application Ser. No. 436,732, filed Oct. 26, 1982, now abandoned.

BACKGROUND OF INVENTION

This invention relates to heat sink assemblies and particularly to such a unit which has substantially improved heat conduction and convection properties.

Heat sink units, particularly those of the plate type have been in use in electrical component assemblies, such as alternators for many years. One of the most important aspects of such units is the maintenance of sufficiently low operating temperatures to preclude damage to the units or increased electrical losses due to high operating temperatures.

This is particularly true in automobile alternator units in which diodes are directly mounted on heat sink plates of the alternator.

SUMMARY AND FEATURES OF THE INVENTION

Accordingly, this invention is directed to improvements in heat sink construction, and particularly to an improvement in heat sink plate design to provide lower operating temperatures.

One of the features of this invention is to provide an improved heat sink assembly for small heat producing electrical elements.

A further feature of this invention is to provide a greater cooling capacity for heat sinks of the plate type.

A still further feature of this invention is to provide a heat sink with enhanced operating characteristics and of simplified construction.

Another feature of this invention is to provide both improved mounting and increased conductive and convective cooling of electrical heat producing elements mounted on the heat sink.

A further feature of this invention is to provide a heat sink which has integral cooling fins.

A still further feature of this invention is to provide a heat sink assembly in which the cooling fins are produced from the single mounting plate and leave a convective opening which substantially enhances cooling flow around and through the heat sink and over the cooling fins.

Another feature of this invention is to provide a new and improved rectifier heat sink for use with alternators on motor vehicles.

A still further feature of this invention is to provide a plurality of upstanding cooling fins on the heat sink which both position heat producing elements on the heat sink and provide for substantially enhanced cooling characteristics.

Another feature of the invention is to provide a balanced cooling fin and convective opening size which gives maximum cooling effect to the heat producing elements mounted on the heat sink.

A still further feature of the invention is the provision of a heat sink mounting assembly in which coolings fins and convective openings provide for more efficient cooling and contribute to enhanced operating characteristics of the equipment with which it is associated.

These and further features of this invention will become apparent from the following description and drawings.

DESCRIPTION OF INVENTION

Figure 1:
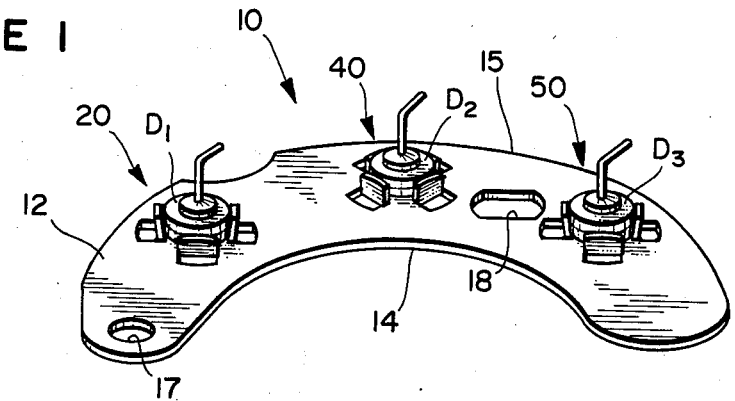
FIG. 1 is a perspective view of a diode rectifier heat sink assembly as used in motor vehicle alternators.

Referring particularly to the figures, the perspective view of the heat sink assembly 10 is shown in FIG. 1 with the diodes $D_1$, $D_2$, and $D_3$, mounted thereon. The heat sink plate 12 has an arcuate shape with the opposite arcuately curved edges 14 and 15. The indent section 16 shown in FIG. 2, as well as the openings 17 and 18 are configured for mounting and clearance purposes for the heat sink plate as it would be mounted on an automobile alternator rectifier unit.

The first diode positioning area generally indicated at 20 is rectangular and holds the diode $D_1$. Upstruck fins 22, 24, 26 and 28 are stamped out of the heat sink plate to create respectively convection openings 23, 25, 27 and 29. The plate is metallic, i.e. steel or aluminum.

Figure 3:
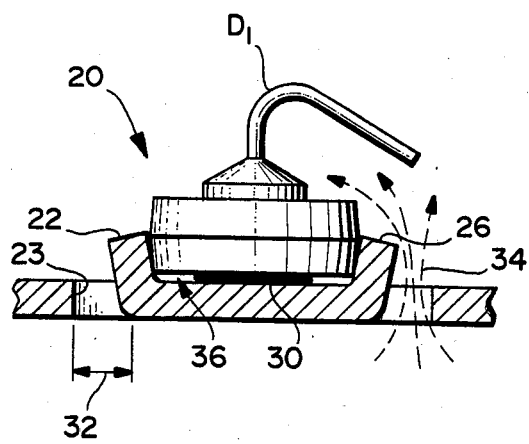
FIG. 3 is a section along line 3—3 of FIG. 2.

The mounting detail for diode $D_1$ is shown in FIG. 3 in which the diode $D_1$ is positioned between the four upwardly extending cooling fins 22, 24, 26 and 28. It is held in position in the rectangular area defined by the four cooling fins which are disposed each on one of the four sides of the rectangular positioning area 20.

The diode $D_1$ is held in position in the diode mounting area by a heat conductive solder layer 30 which serves to hold the diode in position between and in contact with the fins, as well as providing a conductive heat path from the diode to the heat sink plate proper.

It will be seen that the cooling fins are arranged in such a fashion that they are close to the diode and preferably in contact therewith so that there is a direct heat conducting path to the cooling fin from the diode.

FIG. 3 also shows the manner in which the upstruck cooling fins, which are stamped from the heat sink plate, leave a convection opening such as convection opening 23 through which cooling air can pass. The size of the convection opening 23 and the cooling fin 22 are chosen to provide maximum conducting and convective cooling effect. The dashed arrows 34 show the cooling air path through the heat sink opening 27 and upwardly along the cooling fin 26 and over the diode $D_1$. This cooling air path is typical of air flow through each of the convective openings.

In the preferred embodiment of this invention, the width of the positioning area between the fins is one-half inch on each side, and the convective openings are one-eighth by one-quarter inch in dimension. The cooling fins project upwardly one-eighth of an inch.

The rectangular diode positioning area 40 is similar in size and construction to the diode positioning area 20. Upwardly struck cooling fins 42, 44, 46 and 48, respectively, when they are stamped out of the plate leave convective openings 43, 45, 47, and 49. Diode $D_2$ is positioned between the upwardly extending fins and in close proximity and contact with the cooling fins.

Figure 2:
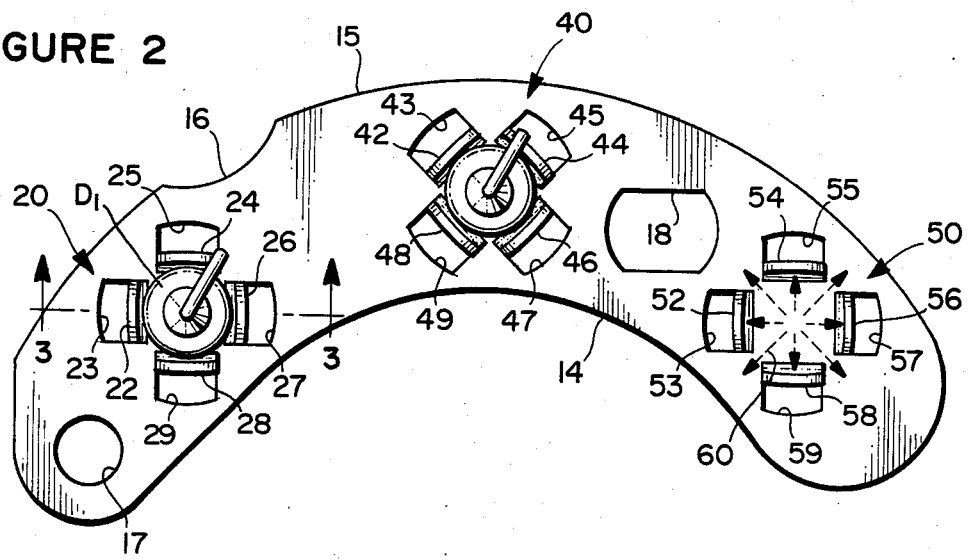
FIG. 2 is a plan view of the heat sink assembly of FIG. 1.

The diode positioning area 50 on the heat sink plate 12 is of identical construction with diode positioning areas 20 and 40. In FIG. 2, the positioning area is shown without the diode $D_3$ in position, to illustrate the conductive path for heat from the central portion of the area.

The upwardly extending cooling fins 52, 54, 56 and 58 are stamped out of the heat sink plate 12 to leave respectively convective openings 53, 55, 57 and 59.

The length of the cooling fins as they extend along the periphery of the positioning areas is approximately the length of the open peripheral area between the cooling fins along the periphery. The cooling fins have a height which is approximately half the height of the side wall of the diode. The cooling fins are arranged along the periphery of the positioning area which is one half inch in diameter. The cooling fins are approximately vertical, and are one-eighth inch in height, and the convection openings approximately one-eighth inch across.

It will be noted that the total area of the convection openings associated with a given positioning area is substantially equal to 0.125 inches so as to permit a substantial amount of cooling air to pass through the mounting plate substantially unimpeded by the mounting plate surface adjacent the positioning area. In the immediate application of mounting diodes, which is illusstrated in FIGS. 1 through 3, four equally spaced cooling fins one quarter of an inch wide are disposed about the periphery of the positioning area. The positioning area is a circle of approximately one half inch in diameter. The diodes are held to the upper surface of the heat sink mounting plate within the positioning area by a layer of solder.

The dashed arrows indicate the manner of heat flow from the central part of the heat sink area 50. The diagonal arrows indicate four direct metal conducting paths from the central part of the plate to the main body of the heat sink through the metal path between adjacent upstanding cooling fins. The remaining four arrows indicate the flow path to the four cooling fins. The latter heat path will pass from along the bottom of the diode positioning area 50 of the plate, as well as directly from the sides of the diodes to the cooling fin when there is contact between the two members.

OPERATION

In order to form the three diode positioning areas 20, 40 and 50 on the heat sink plate 12, the cooling fins are directly stamped out of the heat sink plate itself. This construction provides both a simple and economical manner of installing a cooling fin and convection opening assembly on the heat sink itself.

It is possible to merely place the diode in each of these diode positioning areas, inasmuch as the dimension and spacing of the cooling fins are selected to define a diode positioning area, into which the diode is placed. The fins assist in positioning the diode in the desired location on the plate.

The completed assembly with the diodes soldered in position will permit cooling air to flow through the plate immediately adjacent the diode without being obstructed by the plate itself, to give direct cooling flow to both the fins and diode, as well as other parts of the assembly to which the heat sink assembly is attached. In this assembly operating temperatures are lowered from 20°–40° F.

As a result of this increased cooling flow, and more effective use of heat sink material with the integral upstruck cooling fins, the operating temperature of the heat producing electrical elements, such as the diodes in this case, is lowered. This contributes to the overall operating efficiency of the electrical units, and also is an effective factor in contributing to overall greater operating efficiency of electrical equipment.

The flow through concept, using convection openings immediately adjacent cooling fins in direct or close proximity to the heat producing element, substantially increases the effectiveness of the heat sink plate.

In addition, it is important that the size of the cooling fins and the spacing thereof along the periphery of the diode receiving areas be such that heat flow is possible along two separate paths; namely, along the flat base portion of the heat sink between the fins, as well as up and along the cooling fins immediately adjacent the convection openings.

It will also be noted that the convection openings will cool the flat portion of the heat sink plate immediately adjacent the opening as cooling air flow moves along the bottom surface of the plate and through the convection openings.

While this invention has been described, it will be understood that it is capable of further modification, uses and/or adaptations of the invention following in general the principle of the invention and including such departures from the present disclosure as come within known or customary practice in the art to which the invention pertains, and as may be applied to the essential features hereinbefore set forth, as fall within the scope of the invention or the limits of the appended claims.

What is claimed is:

1. A heat sink mounting plate assembly for alternators, comprising:
   (a) a mounting plate having good conductive characteristics which has a relatively large surface area and is adapted for mounting on an alternator and has a plurality of widely spaced flat surfaced positioning areas,
   (b) a rectifying diode disposed in each of the positioning areas and having a bottom surface integrally connected to the positioning area surface in direct heat conductive contact,
   (c) the periphery of the positioning areas being defined by at least two spaced relatively wide upright cooling fins which position and support the diode within the positioning area with at least one cooling fin of each positioning area being in direct supporting and heat conducting contact with the diode,
   (d) the cooling fins being disposed along the outer periphery of the positioning area in contact with the side surface of the diode so as to dissipate a large proportion of the heat produced by the diode,
   (e) the cooling fins being approximately one half the heighth of the diode, and being arcuately spaced from one another,
   (f) a large convection opening disposed immediately adjacent each cooling fin and extending radially outward and in radial alignment therewith so as to provide a relatively large opening through which cool air may pass,
   (g) sections of the mounting plate between adjacent fins and convection openings constituting a plurality of radially outwardly extending heat conducting convection paths, and
   (h) the convection openings permitting cooling air to pass through the plate flowing over and thereby removing heat from the adjacent sections of the plate, the cooling fins, and the diode.

2. The heat sink mounting plate assembly for alternators as set forth in claim 1, wherein:
   (a) the width of the cooling fins is approximately equal to the width of the mounting plate section between adjacent cooling fins.

3. The heat sink mounting plate assembly for alternators as set forth in claim 1, wherein:
   (a) the cooling fins are an integral part of the mounting plate and are cut out therefrom to provide both the upstanding cooling fin and its adjacent convection opening.

4. The heat sink mounting plate assembly for alternators as set forth in claim 3, wherein:
   (a) the total area of the convection openings associated with a given positioning area is substantially equal to 0.125 inches.

5. The heat sink mounting plate assembly for alternators as set forth in claim 3, wherein:
   (a) four equally spaced cooling fins one quarter of an inch wide are disposed about the periphery of its positioning area, the positioning area being a circle of approximately one half inch in diameter and,
   (b) the cooling fins are approximately vertical, and are one-eight inch in height.

6. The heat sink mounting plate assembly for alternators as set forth in claim 1, wherein:
   (a) each diode is held to the surface of the positioning areas by heat conducting solder.

* * * * *